United States Patent
Goren et al.

(10) Patent No.: US 7,103,488 B2
(45) Date of Patent: Sep. 5, 2006

(54) METHOD FOR DETERMINING FRINGING CAPACITANCES ON PASSIVE DEVICES WITHIN AN INTEGRATED CIRCUIT

(75) Inventors: David Goren, Nesher (IL); John Katzenstein, Chicago, IL (US); Youri V. Tretiakov, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 10/710,511

(22) Filed: Jul. 16, 2004

(65) Prior Publication Data

US 2006/0015276 A1 Jan. 19, 2006

(51) Int. Cl.
G01R 27/00 (2006.01)

(52) U.S. Cl. .......................... 702/65; 702/117
(58) Field of Classification Search .................. 702/38, 702/57, 65, 115, 117, 182; 703/2, 13, 14; 257/59, 60, 510, 10, 14, 18; 324/769
See application file for complete search history.

(56) References Cited

U.S. PATENT DOCUMENTS

2002/0007258 A1* 1/2002 Tsai .............................. 703/2
2004/0251513 A1* 12/2004 Su et al. ...................... 257/510

* cited by examiner

*Primary Examiner*—Bryan Bui

(74) *Attorney, Agent, or Firm*—Richard M. Kotulak; Dillon & Yudell LLP

(57) ABSTRACT

A method for detemiining fringing capacitances on passive devices within an integrated circuit is disclosed. A fringing capacitance region on a passive device is initially divided into a group of fringing electric field areas. A set of fringing capacitance equations is then developed for the fringing electric field areas accordingly. A determination is made as to whether or not an accuracy of the fringing capacitance equations meets a predetermined threshold. If so, then the fringing capacitance equations are utilized in compact device models to determine fringing capacitance on the passive device; otherwise, the physically-based fringing capacitance equations are fitted to a set of extracted data to generate a refined set of physically-based fringing capacitance equations, and the refined set of physically-based fringing capacitance equations is utilized in compact device models to determine fringing capacitance on the passive device.

24 Claims, 4 Drawing Sheets

METHOD FOR DETERMINING FRINGING CAPACITANCES ON PASSIVE DEVICES WITHIN AN INTEGRATED CIRCUIT

BACKGROUND OF INVENTION

1. Technical Field

The present invention relates to software tools in general, and, in particular, to a method within a software tool for verifying integrated circuit designs. Still more particularly, the present invention relates to a method within a software tool for determining fringing capacitances on single-layer and multi-layer on-chip passive devices.

2. Description of Related Art

On-chip passive devices can have a single or multiple back-end of the line (BEOL) metal layers. Currently, some foundry offers passive on-chip devices as a part of its design kits. Such passive on-chip devices can be spiral inductors (including multi-layer stacked inductors), transmission lines (microstrip and co-planar waveguide inter-connects including stacked metal line over a silicon substrate), bond pads and capacitors (MIM and vertically stacked parallel-plate). Each passive device is supported by schematic symbol, layout parameterized cell (Pcell), design rule checking (DRC), extraction and layout versus schematic (LVS) decks as well by a compact model that allows both time-domain and frequency-domain simulations such as parametric, temperature dependence and Monte-Carlo runs.

Whenever possible, it is very important to have analytical equations for the area, fringing and mutual capacitances of the on-chip passive devices. Although area capacitance calculations are usually quite straight-forward, the generation of analytical equations for fringing and mutual capacitances tends to be more difficult. Nevertheless, all capacitance terms (i.e., area, fringing and mutual) are required by any compact device model.

There are many drawbacks associated with the prior art methods of calculating fringing capacitance. For example, polynomial-based fringing capacitance equations are not always physically based; thus, the initial errors in polynomial fitting procedure can be relatively large, which may cause problems in accuracy and stability of a numerical convergence, etc. Consequently, it would be desirable to provide an improved method for determining fringing capacitances on on-chip passive devices.

SUMMARY OF INVENTION

In accordance with a preferred embodiment of the present invention, a fringing capacitance region on a passive device is divided into a group of fringing electric field areas. A set of physically-based fringing capacitance equations is developed for the fringing electric field areas accordingly. A determination is made as to whether or not an accuracy of the set of physically-based fringing capacitance equations meets a predetermined threshold. If the accuracy of the set of physically-based fringing capacitance equations meets the predetermined threshold, the set of physically-based fringing capacitance equations is utilized in compact device models to determine fringing capacitance on the passive device. If the accuracy of the set of physically-based fringing capacitance equations does not meet the predetermined threshold, the set of physically-based fringing capacitance equations is fitted to a set of extracted data to generate a refined set of physically-based fringing capacitance equations, and the refined set of physically-based fringing capacitance equations is utilized in compact device models to determine fringing capacitance on the passive device.

All features and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

I. FORMATION OF ANALYTICAL FRINGING CAPACITANCE EQUATIONS

Figure 1:
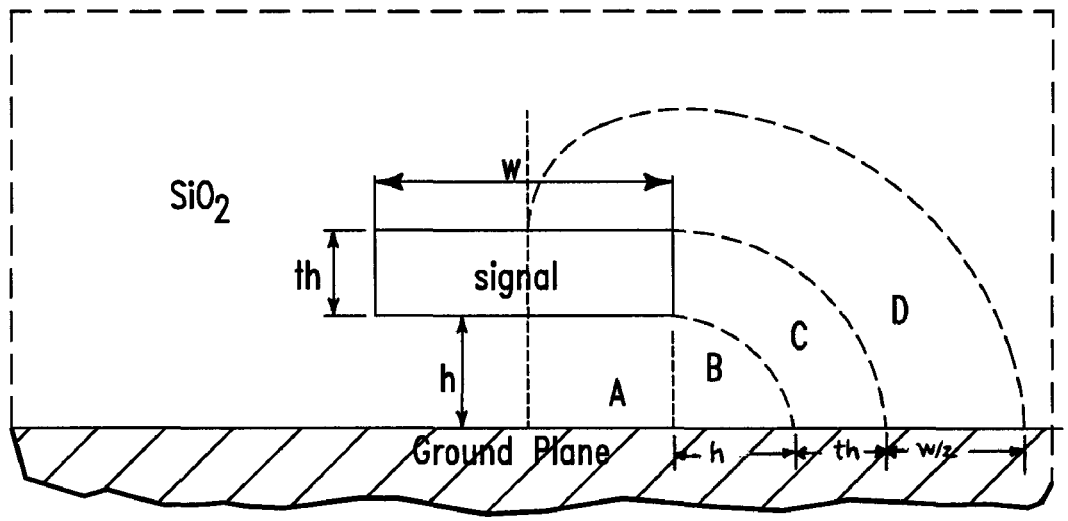
FIG. 1 illustrates a signal wire located above a ground plane on which an analytical fringing capacitance equation is based, in accordance with a preferred embodiment of the present invention.

An analytical fringing capacitance equation is initially derived according to an estimated quasi-static electric field distribution. Referring now to the drawings and in particular to FIG. 1, there is graphically illustrated a signal wire located above a ground plane on which an analytical fringing capacitance equation is based, in accordance with a preferred embodiment of the present invention. As shown, the fringing electric field region between the wire and the ground is divided into four areas A, B, C and D. Because of symmetry, only half of the geometry shown in FIG. 1 will be considered.

In FIG. 1, area A corresponds to a parallel plate capacitance, which can be calculated by $$C_A = \varepsilon_0 \varepsilon_r \frac{w}{2h} L \qquad (1)$$

where w and h are various thickness and distances shown in FIG. 1 and L is the device length. The fringing capacitance formed by areas B, C and D are the main focus of the present invention. In order to calculate the total fringing capacitance for the configuration shown in FIG. 1, the following steps (and assumptions) are utilized:

i. Draw reasonable field lines for the defined areas, such as assuming that areas C and D are formed by quarter circle electric field lines.

ii. Calculate the length of an each field line by using $$\int dl$$

iii. Calculate the electric field along each field line, which is constant, by using $$E = \frac{V}{\int dl}$$

iv. Calculate the charges of the defined area by using Gauss Law $$q = \varepsilon_0 \varepsilon_r \int_S \left( \vec{E} \cdot \vec{ds} \right)$$

v. Calculate the capacitance per unit length by using $$C = \frac{q}{V}$$

By taking all of the above-mentioned steps (and assumptions), the following capacitance equations can be arrived:

$$C_B = \varepsilon_0 \varepsilon_r \frac{2}{\pi - 2} \ln\left(\frac{\pi}{2}\right) L \quad (2)$$

$$C_C(th, h) = \varepsilon_0 \varepsilon_r \frac{2}{\pi} \ln\left(1 + \frac{th}{h}\right) L \quad (3)$$

$$C_D(w, th, h) = \varepsilon_0 \varepsilon_r \frac{1}{\pi} \ln\left(1 + \frac{w}{h + th}\right) L \quad (4)$$

where w, h and th are various thickness and distances shown in FIG. 1, $C_B$ is fringing capacitance formed by area B, $C_C$ is fringing capacitance formed by area C, and $C_D$ is fringing capacitance formed by area D.

$$C_{fringing} = 2 \cdot \varepsilon_0 \varepsilon_r \left[ \frac{2}{\pi-2} \ln\left(\frac{\pi}{2}\right) + \frac{2}{\pi} \ln\left(1 + \frac{th}{h}\right) + \frac{1}{\pi} \ln\left(1 + \frac{w}{h+th}\right) \right] L \quad (5)$$

Equation (5) can be further modified into:

$$C_{fringing} = 2 \cdot \varepsilon_0 \varepsilon_r \left[ a + b \cdot \ln\left(1 + \frac{th}{h}\right) + c \cdot \ln\left(1 + \frac{w}{h+th}\right) \right] L \quad (6)$$

Equation (6) is more general and can be adapted for any particular technology using any fitting procedure with respect to coefficients a, b and c.

Figure 2:
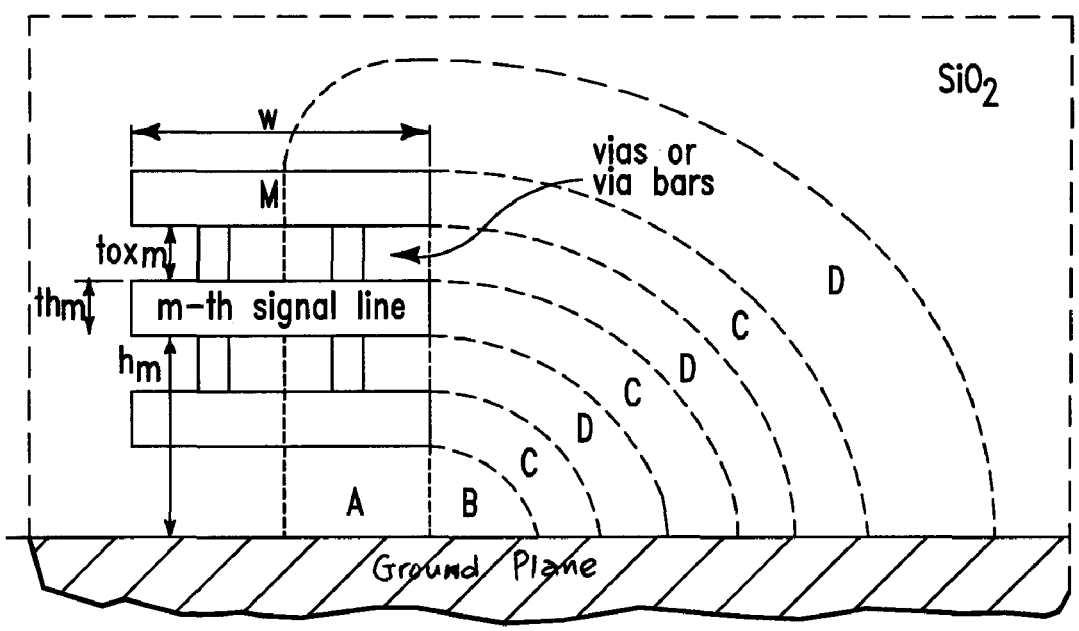
FIG. 2 illustrates a multi-layer passive device located above a ground plane on which an analytical fringing capacitance equation is based, in accordance with a preferred embodiment of the present invention.

With reference now to FIG. 2, there is graphically illustrated a multi-layer (stacked) passive device located above a ground plane on which an analytical fringing capacitance equation is based, in accordance with a preferred embodiment of the present invention. After a number of numerical simulations, it has been found that vias or via bars do not contribute much into fringing capacitance. Based on such information, the analytical fringing capacitance equation for a multi-layer passive device configuration shown in FIG. 2 can be simply given by:

$$C_{fringing} = 2 \left( C_B + \sum_{m=1}^{M} C_C(th_m, h_m) + \sum_{m=1}^{M-1} C_D(2tox_m, th_m, h_m) + C_D(w, th_M, h_M) \right) \quad (7)$$

$$= 2\varepsilon_0 \varepsilon_r \left[ \frac{2}{\pi - 2} \ln\left(\frac{\pi}{2}\right) + \frac{2}{\pi} \sum_{m=1}^{M} \ln\left(1 + \frac{th_m}{h_m}\right) + \frac{1}{\pi}\left(\sum_{m=1}^{M-1} \ln\left(1 + \frac{2tox_m}{h_m + th_m}\right) + \ln\left(1 + \frac{w}{h_M + th_M}\right)\right) \right] L$$

where $th_m$, $tox_m$, $h_m$ are various thickness and distances shown in FIG. 2 and M is the top signal conductor and L is the device length.

Equation (7) can be further modified to $$C_{fringing} = 2\varepsilon_0 \varepsilon_r \left[ a + b \sum_{m=1}^{M} \ln\left(1 + \frac{th_m}{h_m}\right) + c \left( \sum_{m=1}^{M-1} \ln\left(1 + \frac{2 \cdot tox_m}{h_m + th_m}\right) + \ln\left(1 + \frac{w}{h_M + th_M}\right) \right) \right] L \quad (8)$$

As in the case of equation (6), equation (8) is more general and can be adapted to any particular technology using any well-known fitting procedure.

II. APPLICATION OF ANALYTICAL FRINGING CAPACITANCE EQUATIONS

Figure 3:
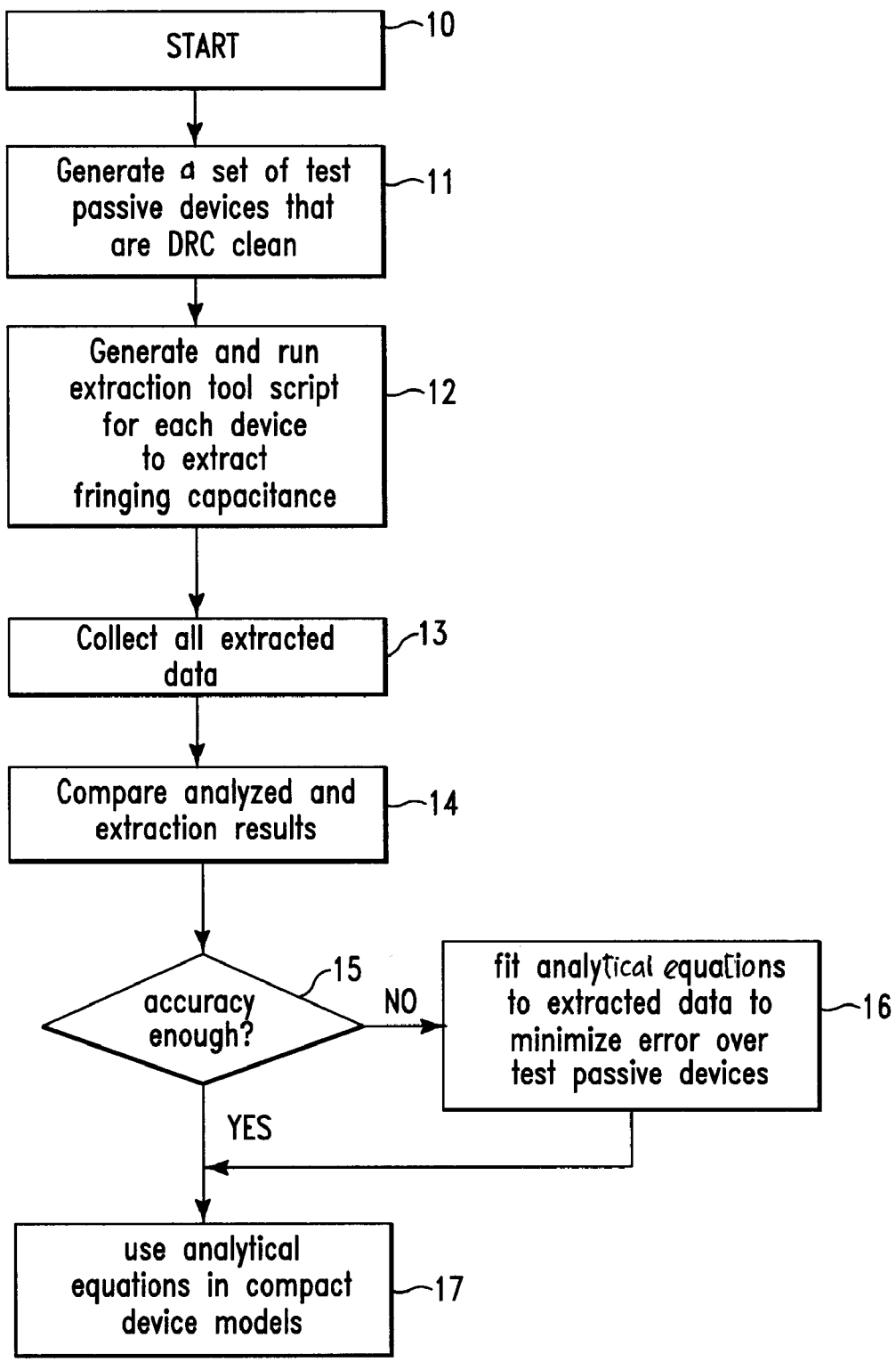
FIG. 3 is a high-level logic flow diagram of a method for determining fringing capacitances on passive devices, in accordance with a preferred embodiment of the present invention.

Referring now to FIG. 3, there is illustrated a high-level logic flow diagram of a method for determining fringing capacitance on a passive device, in accordance with a preferred embodiment of the present invention. Starting at block 10, for a given back-end of the line (BEOL) metal stack, a set of test passive devices (at least hundreds of test passive devices), which has passed design rule checking (DRC), is generated, as shown in block 11. Then, the fringing capacitance is extracted from each of the test passive devices, as depicted in block 12. Such extraction can be performed by using software tools such as Quick-Cap™ in combination with Matlab™ for large test databases. Next, the extraction data are collected in a database, as shown in block 13. The extraction data are then compared to the results from a physically-based analytical fringing capacitance equation (as described previously) to determine if the accuracy of the analytical fringing capacitance equation is sufficient, as depicted in blocks 14 and 15. If the accuracy of the results from the physically-based analytical fringing capacitance equation is not sufficient, the physically-based analytical fringing capacitance equation is fitted to the extraction data to minimize error over the set of test passive devices, as shown in block 16. If the accuracy of the physically-based analytical fringing capacitance equation is sufficient, then the physically-based analytical fringing capacitance equation is used in compact device models, as depicted in block 17.

III. APPLICATION EXAMPLES

Example 1

Single-wire Microstrip Transmission Line

The capacitances for a single-wire microstrip transmission line includes two parts, namely, area and fringing capacitances. The area capacitance can be calculated using equation (1). After an analytical capacitance equation has been developed, the fringing capacitance can be determined using the methodology shown in FIG. 3.

Figure 4:
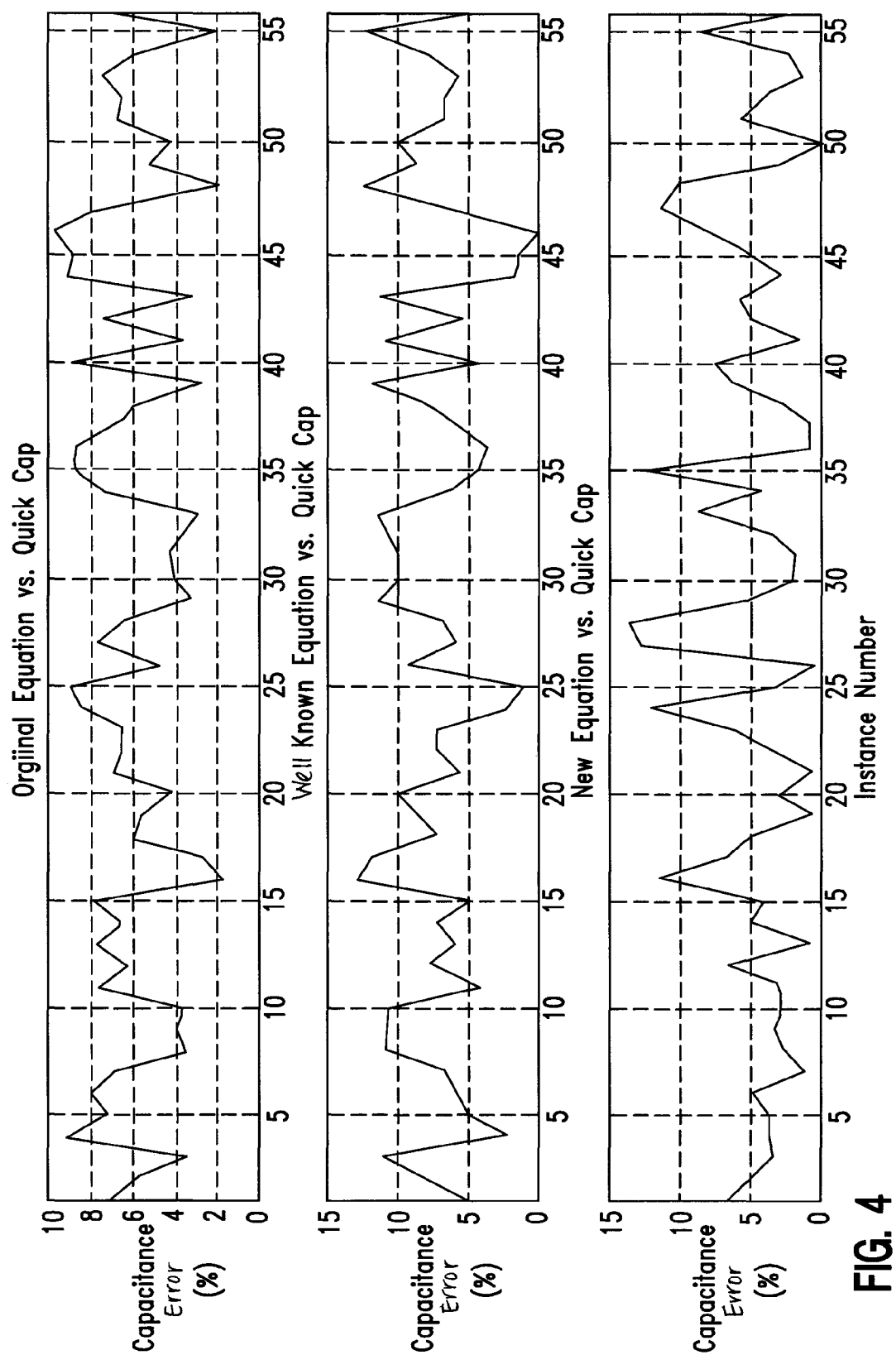
FIG. 4 illustrates the final verification results of an analytical fringing capacitance equation.

The verification results of the analytical capacitance equation is shown in FIG. 4. According to the methodology in FIG. 3, an extraction software (such as QuickCap™) is initially used to generate a large capacitance (area+fringing) database. Then, the obtained database and equations (1) and (5) are utilized to check the accuracy of the initial analytical capacitance equation. As shown in FIG. 4, the maximum error for the analytical fringing capacitance equation is approximately 9%. The extracted capacitance database is also checked against the well-known capacitance calculation equation $$C = \varepsilon_0 \varepsilon_r \left[ 1.15 \frac{w}{h} + 2.80 \left( \frac{th}{h} \right)^{0.222} \right] L \quad (9)$$

where w, h and th are various thickness and distances shown in FIG. 1 and L is the device length. Equation (9) has a maximum error of approximately 13%.

If a numerical error of approximately 10% is acceptable, then the equation generation process is complete and equations (1) and (5) can be used for fringing capacitance calculations. For example, when the accuracy of the analytical fringing capacitance equation is sufficient, the analytical fringing capacitance equation can be used in single-wire interconnect compact model. Otherwise, an attempt is made to minimize the overall error by using the extracted capacitance database, equations (1), (6) and numerical fitting to find coefficients a, b and c of equation (6), which give a minimum of the maximum or mean error. FIG. 4 shows the results of such a numerical fitting procedure, and the maximum error can be minimized to be approximately 2.7%. After that, the refined analytical fringing capacitance equation along equation (1) can be used in the single-wire interconnect compact model.

Example 2

Multi-layer Single Wire Located Above An Infinite Ground Plane

In production, the infinite ground plane for the multi-layer (stacked) RF_line device configuration as shown in FIG. 2 is actually a silicon substrate. The accuracy of equation (7) versus the number of metal layers from which R_line is constructed is verified. In the present example, the fringing capacitance of interest is due to the electric field in $SiO_2$ at low frequency when the silicon substrate behaves as a good electric conductor. Table I shows the results (per unit length) of numerical comparison using IBM CZ2D fringing capacitance data and the results obtained using equation (7) for a specific process technology.

TABLE I

| number of layers | width (um) | $C_{fringing}$ IBM CZ2D ($10^{-10}$ F/m) | $C_{fringing}$ equation 7 ($10^{-10}$ F/m) | error (%) |
|---|---|---|---|---|
| 1 | 2.0 | 0.99248 | 0.96375 | 2.89 |
| 2 | 2.0 | 1.15673 | 1.10287 | 4.66 |
| 3 | 2.0 | 1.26228 | 4.35372 | 4.35 |
| 4 | 2.0 | 1.33868 | 1.29148 | 3.53 |
| 5 | 2.0 | 1.39720 | 1.36216 | 2.51 |
| 6 | 2.0 | 1.44365 | 1.42318 | 1.42 |
| 7 | 2.0 | 1.48143 | 1.47691 | 0.31 |
| 8 | 2.0 | 1.51277 | 1.51277 | 0.80 |
| 9 | 2.0 | 1.53960 | 1.56837 | 1.87 |
| 10 | 2.0 | 1.56710 | 1.60803 | 2.61 |

As shown, the maximum error is approximately 5%. If such upper limit is acceptable, then equation (7) can be used without any modification in a compact device model. Otherwise, equation (8) and the methodology shown in FIG. 3 are used to find the best choice of coefficients a, b and c in equation (8) that gives a minimum of the maximum or mean error for a specific process technology and device under questions.

Figure 5:
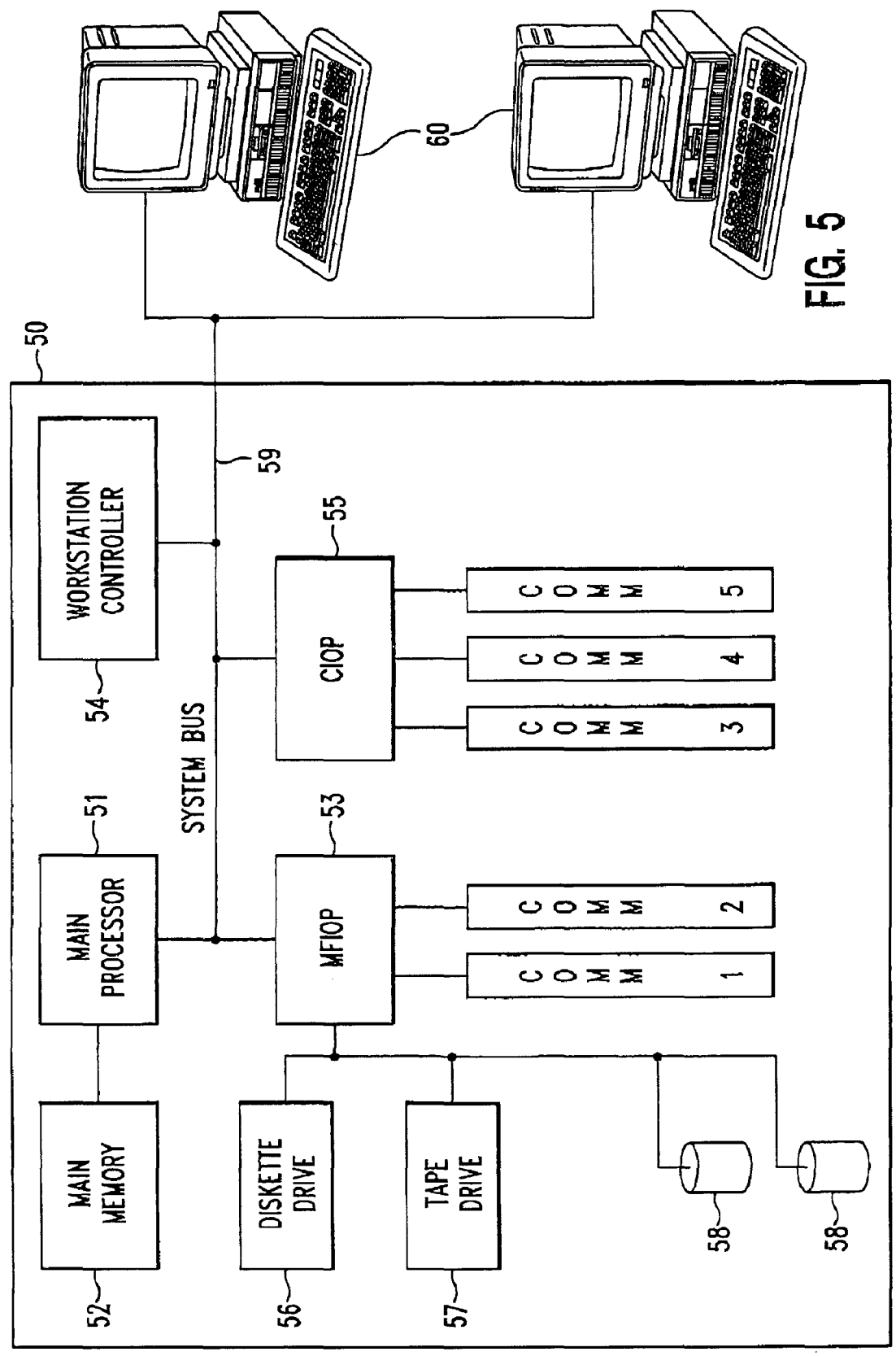
FIG. 5 is a block diagram of a computer system in which a preferred embodiment of the present invention be implemented.

Referring now to FIG. 5, there is depicted a block diagram of a computer system in which a preferred embodiment of the present invention be implemented. As shown, a computer system 50 includes a main processor 51 coupled to a main memory 52 and a multiI/O processor MFIOP 53. Main processor 51 may include a single processor or multiple processors. Several peripheral storage devices, such as a diskette drive 56, a tape drive 57, and a direct access storage devices (DASDs) 58, are controlled by MFIOP 53. In addition, MFIOP 53 provides communications to other devices via communication ports such as COMM 1 and COMM 2.

A workstation con54 is coupled to a communications I/O processor (CIOP) 55 via a system bus 59. Workstation controller 54 provides communications between main proces51 and workstations 60 that may be connected to computer system 50. CIOP 55 provides communications to other devices via communication ports such as COMM3, COMM4, and COMM5.

As has been described, the present invention provides a method for determining fringing capacitance on passive devices. The method of the present invention is applicable to compact predictive modeling of a wide variety of on-chip parameterized passive devices, including single-layer and vertically stacked passive devices. The method of the present invention allows fast and accurate fringing capacitance equation development once the technology and device type have been specified. The method of the present invention uses standard commercial tools such as Matlab™ and QuickCap™ software (or other capacitance extraction tools) and can be fully automated.

After analytical fringing capacitance equations have been developed, there is no need to use extraction software for supported in the design kit passives, unless a circuit designer is developing a completely new passive device that is not part of a foundry offering. The developed analytical fringing capacitance equations can be used in compact device models and can be incorporated within the industry standard simulation engines such as HSpice, Spectre™ and SpectreS™.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

While the invention has been particularly shown and described with reference to a preferred embodiment, it will be understood by those skilled in the art that various changes in form and detail may be made therein without departing from the spirit and scope of the invention.

The invention claimed is:

1. A method for determining fringing capacitance on a passive device within an integrated circuit, said method comprising:
   dividing a fringing capacitance region on said passive device into a plurality of fringing electric field areas;
   developing a set of physically-based fringing capacitance equations for said plurality of fringing electric field areas accordingly;
   determining whether or not an accuracy of said set of physically-based fringing capacitance equations meets a predetermined threshold; and
   in response to a determination that an accuracy of said set of physically-based fringing capacitance equations meets said predetermined threshold, utilizing said set of physically-based fringing capacitance equations in compact device models to determine fringing capacitance on said passive device.

2. The method of claim 1, wherein said method further includes in response to a determination that an accuracy of said set of physically-based fringing capacitance equations does not meet said predetermined threshold, fitting said set of physically-based fringing capacitance equations to a set of extracted data to generate a refined set of physically-based fringing capacitance equations; and
   utilizing said refined set of physically-based fringing capacitance equations in compact device models to determine fringing capacitance on said passive device.

3. The method of claim 2, wherein said set of extracted data is produced by extracting a fringing capacitance from a plurality of test passive devices.

4. The method of claim 3, wherein said determining further includes comparing results obtained from said set of physically-based fringing capacitance equations and said set of extracted data.

5. The method of claim 1, wherein electric field is constant along each field line within said plurality of fringing electric field areas.

6. The method of claim 1, wherein electric field within some of said plurality of fringing electric field areas is formed by quarter circular lines.

7. The method of claim 1, wherein electric field within some of said plurality of fringing electric field areas is formed by a quarter circular line in combination with a vertical straight line.

8. The method of claim 1, wherein effects from inter-layer vias are ignored from said set of physically-based fringing capacitance equations.

9. A computer program product residing on a computer usable medium for determining fringing capacitance on a passive device within an integrated circuit, said computer program product comprising:
   program code means for dividing a fringing capacitance region on said passive device into a plurality of fringing electric field areas;
   program code means for developing a set of physically-based fringing capacitance equations for said plurality of fringing electric field areas accordingly;
   program code means for determining whether or not an accuracy of said set of physically-based fringing capacitance equations meets a predetermined threshold; and
   program code means for utilizing said set of physically-based fringing capacitance equations in compact device models to determine fringing capacitance on said passive device, in response to a determination that an accuracy of said set of physically-based fringing capacitance equations meets said predetermined threshold.

10. The computer program product of claim 9, wherein said computer program product further includes in response to a determination that an accuracy of said set of physically-based fringing capacitance equations does not meet said predetermined threshold,
    program code means for fitting said set of physically-based fringing capacitance equations to a set of extracted data to generate a refined set of physically-based fringing capacitance equations; and
    program code means for utilizing said refined set of physically-based fringing capacitance equations in compact device models to determine fringing capacitance on said passive device.

11. The computer program product of claim 10, wherein said set of extracted data is produced by program code means for extracting a fringing capacitance from a plurality of test passive devices.

12. The computer program product of claim 11, wherein said program code means for determining further includes program code means for comparing results obtained from said set of physically-based fringing capacitance equations and said set of extracted data.

13. The computer program product of claim 9, wherein electric field is constant along each field line within said plurality of fringing electric field areas.

14. The computer program product of claim 9, wherein electric field within some of said plurality of fringing electric field areas is formed by quarter circular lines.

15. The computer program product of claim 9, wherein electric field within some of said plurality of fringing electric field areas is formed by a quarter circular line in combination with a vertical straight line.

16. The computer program product of claim 9, wherein effects from interlayer vias are ignored from said set of physically-based fringing capacitance equations.

17. A computer system for determining fringing capacitance on a passive device within an integrated circuit, said computer system comprising:
    means for dividing a fringing capacitance region on said passive device into a plurality of fringing electric field areas;
    means for developing a set of physically-based fringing capacitance equations for said plurality of fringing electric field areas accordingly;
    means for determining whether or not an accuracy of said set of physically-based fringing capacitance equations meets a predetermined threshold; and
    means for utilizing said set of physically-based fringing capacitance equations in compact device models to determine fringing capacitance on said passive device, in response to a determination that an accuracy of said set of physically-based fringing capacitance equations meets said predetermined threshold.

18. The computer system of claim 17, wherein said method further includes in response to a determination that an accuracy of said set of physically-based fringing capacitance equations does not meet said predetermined threshold,
- means for fitting said set of physically-based fringing capacitance equations to a set of extracted data to generate a refined set of physically-based fringing capacitance equations; and
- means for utilizing said refined set of physically-based fringing capacitance equations in compact device models to determine fringing capacitance on said passive device.

19. The computer system of claim 18, wherein said set of extracted data is produced by means for extracting a fringing capacitance from a plurality of test passive devices.

20. The computer system of claim 19, wherein said means for determining further includes means for comparing results obtained from said set of physically-based fringing capacitance equations and said set of extracted data.

21. The computer system of claim 17, wherein electric field is constant along each field line within said plurality of fringing electric field areas.

22. The computer system of claim 17, wherein electric field within some of said plurality of fringing electric field areas is formed by quarter circular lines.

23. The computer system of claim 17, wherein electric field within some of said plurality of fringing electric field areas is formed by a quarter circular line in combination with a vertical straight line.

24. The computer system of claim 17, wherein effects from interlayer vias are ignored from said set of physically-based fringing capacitance equations.

* * * * *